United States Patent
Kudo et al.

[11] Patent Number: 5,126,027
[45] Date of Patent: Jun. 30, 1992

[54] THIN FILM FORMING METHOD AND SYSTEM

[76] Inventors: Hideo Kudo, 9-30-2-201, Miwa, Nagano-shi, Nagano, 380; Shigeru Tani, 433-10, Kojima, Nagano-shiu, Nagano 381; Yasushi Tamaki, 28-3, Kitajou, Nagano-shi, Nagano, 381; Genichi Ishida, 2-25-601, Ebizuka, Hamamatsu-shi, Shizuoka, 432; Shoji Ishida, 431, Kitaowaribe, Nagano-shi, Nagano, 381; Seigo Toyofuku, 1641, Kitanagaike, Ohaza, Nagano-shi, Nagano, 381; Fumio Fukasawa, 6797, Yawata, Ohaza, Koushoku-shi, Nagano, 387, all of Japan

[21] Appl. No.: 596,826

[22] Filed: Oct. 12, 1990

[30] Foreign Application Priority Data

Oct. 16, 1989 [JP] Japan ................................ 1-268375

[51] Int. Cl.$^5$ ........................ C23C 14/34; B65G 1/06
[52] U.S. Cl. ........................ 204/192.13; 204/192.2; 204/298.03; 204/298.09; 204/298.25; 204/298.26; 198/346
[58] Field of Search ............ 204/192.12, 192.13, 204/298.09, 298.03, 298.23, 298.25, 298.26, 298.27, 192.2, 298.28; 118/719, 724, 725; 414/222; 198/346, 347.1

[56] References Cited

U.S. PATENT DOCUMENTS

| | | | |
|---|---|---|---|
| 4,643,629 | 2/1987 | Takahaski et al. | 204/298.25 X |
| 4,747,928 | 5/1988 | Takahashi et al. | 204/298.09 |
| 4,832,981 | 5/1989 | Yamazaki | 204/298.25 X |
| 4,851,101 | 7/1989 | Hutchinson | 204/298.09 |
| 4,913,790 | 4/1990 | Narita et al. | 204/298.09 X |
| 4,952,299 | 8/1990 | Chrisos et al. | 204/298.25 |
| 4,975,168 | 12/1990 | Ohno et al. | 204/298.25 X |

FOREIGN PATENT DOCUMENTS

| | | |
|---|---|---|
| 112611 | 2/1984 | Japan . |
| 315134 | 3/1989 | Japan . |

Primary Examiner—Nam Nguyen
Attorney, Agent, or Firm—Nikaido, Marmelstein, Murray & Oram

[57] ABSTRACT

A thin film forming method includes the steps of preheating a plurality of base plates placed at a first position, sequentially picking up the base plates one by one and positioning a picked-up base plate at a second position, heating the picked-up base plate at the second position so that a temperature of the picked-up base plate becomes approximately equal to a predetermined temperature, moving the picked-up base plate from the second position to a third position, and growing a thin film on a surface of the picked-up base plate at the third position.

22 Claims, 8 Drawing Sheets

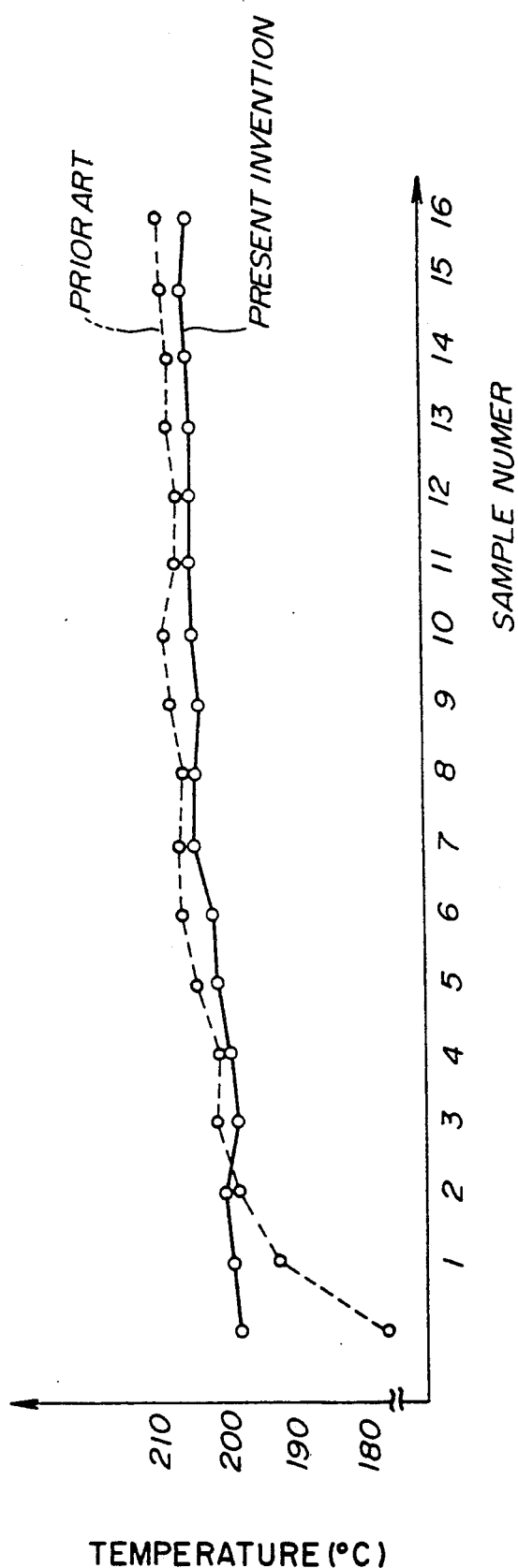

THIN FILM FORMING METHOD AND SYSTEM

BACKGROUND OF THE INVENTION

The present invention generally relates to a thin film forming method and system, and more particularly to a thin film forming method and system suitable for fabricating a disk-shaped recording media provided in a disk storage device frequently used as an external storage device of a data processing device.

A disk storage device is widely used in a computer system. Particularly, a magnetic hard disk has a large storage capacity. A magnetic hard disk has a disk-shaped base having thin films made of a magnetic material on both sides thereof. In order to obtain uniform characteristics of thin films on each disk-shaped base, it is particularly necessary to uniformly grow the thin films on both the sides of the disk-shaped base. In addition, it is necessary to produce magnetic hard disks having almost the same characteristic in commercial quantity.

The growth of the thin films on the disk-shaped base by use of a vacuum apparatus depends on various film growth conditions, such as the temperature of the disk base, the film growth pressure, the amount of flowing a gas and the attainability of vacuum. Particularly, the characteristics of thin films are greatly affected by the temperature of the disk base.

A conventional thin film forming system (manufactured by, for example, NICHIDEN ANERUBA, Japan) has a heating means, such as a lamp heater, for heating disk bases so that the temperatures of the disk bases are maintained at a predetermined temperature. Normally, a group of a plurality of disk bases held by a holder is heated together by the lamp heater and then inserted into a vacuum room of the vacuum apparatus. Then, a thin film growing process is carried out for the disk bases of the same group one by one. Thus, the temperatures of the disk bases obtained when the sputtering process is respectively carried out for the disk bases one by one are greatly different from each other. The above fact causes differences of characteristics of the magnetic disks.

SUMMARY OF THE INVENTION

It is a general object of the present invention to provide an improved thin film growing method and system in which the aforementioned disadvantages are eliminated.

A more specific object of the present invention is to provide a thin film growing method and system in which the temperature of each disk base obtained immediately before a film growing process is carried out one by one is regulated at an almost identical temperature, so that storage disks having almost the same characteristics can be produced in commercial quantity.

The above-mentioned objects of the present invention are achieved by a thin film forming method comprising the steps of:

(a) preheating a plurality of base plates placed at a first position;

(b) sequentially picking up said base plates one by one and positioning a picked-up base plate at a second position;

(c) heating said picked-up base plate at said second position so that a temperature of said picked-up base plate becomes approximately equal to a predetermined temperature;

(d) moving said picked-up base plate from said second position to a third position; and (e) growing a thin film on a surface of said picked-up base plate at said third position.

The aforementioned objects of the present invention are also achieved by a thin film forming system comprising:

first heating means for preheating a plurality of base plates placed in a first room;

pick up means for sequentially picking up the base plates one by one and for placing a picked-up base plate at a predetermined waiting position in the first room;

second heating means for heating the picked-up base plate at the predetermined waiting position;

temperature measuring means for measuring a temperature of the picked-up base plate at the predetermined waiting position;

control means for controlling the temperature measuring means so that the temperature of the picked-up base plate measured by the temperature measuring means becomes approximately equal to a predetermined temperature;

moving means for moving the picked-up base plate from the predetermined waiting position in the first room to a second room; and thin film forming means for growing a thin film on a surface of the picked-up base plate in the second room.

The aforementioned objects of the present invention are also achieved by a thin film forming system comprising:

conveyer means for transporting a holder holding a plurality of base plates to a first room;

first heating means for heating the plurality of base plates held by the holder so that temperatures of the base plates respectively become approximately equal to a first predetermined temperature;

first arm means for picking up the base plates from the holder one by one and for successively placing, one by one, the base plates at a predetermined waiting position in the first room;

temperature measuring means for measuring the temperature of one base plate at the predetermined waiting position;

second arm means for receiving the one base plate at the predetermined waiting position and for placing the one base plate in a second room close to the predetermined waiting position;

second heating means, provided near the predetermined waiting position, for heating the one base plate at the predetermined waiting position;

control means, coupled to the temperature measuring means and the second heating means, for controlling the second heating means on the basis of the temperature of the one base plate measured by temperature measuring means so that the temperature of the one base plate becomes approximately equal to a second predetermined temperature; and thin film forming means for growing a thin film on a surface of the one base plate placed by the second arm means.

The aforementioned objects of the present invention are also achieved by a thin film forming system comprising:

first heating means for preheating a plurality of base plates placed at a first position;

pick up means for sequentially picking up the base plates one by one and positioning a picked-up base plate at a second position;

second heating means for heating the picked-up base plate at the second position so that a temperature of the picked-up base plate becomes approximately equal to a predetermined temperature;

moving means for moving the picked-up base plate from the second position to a third position; and thin film forming means for forming a thin film on a surface of the picked-up base plate at the third position.

BRIEF DESCRIPTION OF THE DRAWINGS

Other objects, features and advantages of the present invention will become more apparent from the following detailed description when read in conjunction with the accompanying drawings, in which:

FIG. 8 is a graph illustrating an advantage presented by the invention, compared to a prior art.

DESCRIPTION OF THE PREFERRED EMBODIMENTS

A description will be given of a first preferred embodiment of the present invention.

Figure 1:
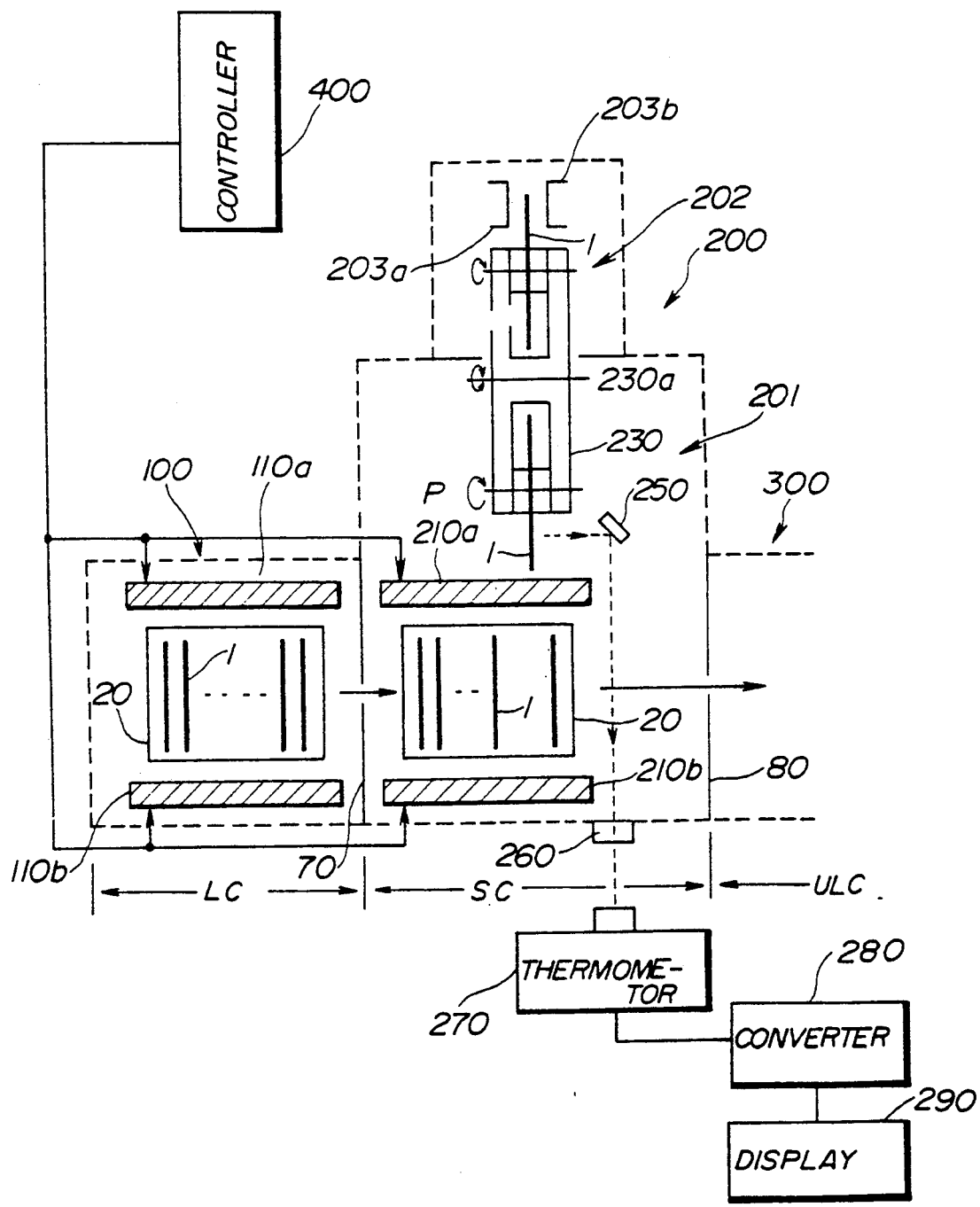
FIG. 1 is a diagram illustrating the entire structure of a double side continuous sputtering system according to a first preferred embodiment of the present invention.
Figure 2:
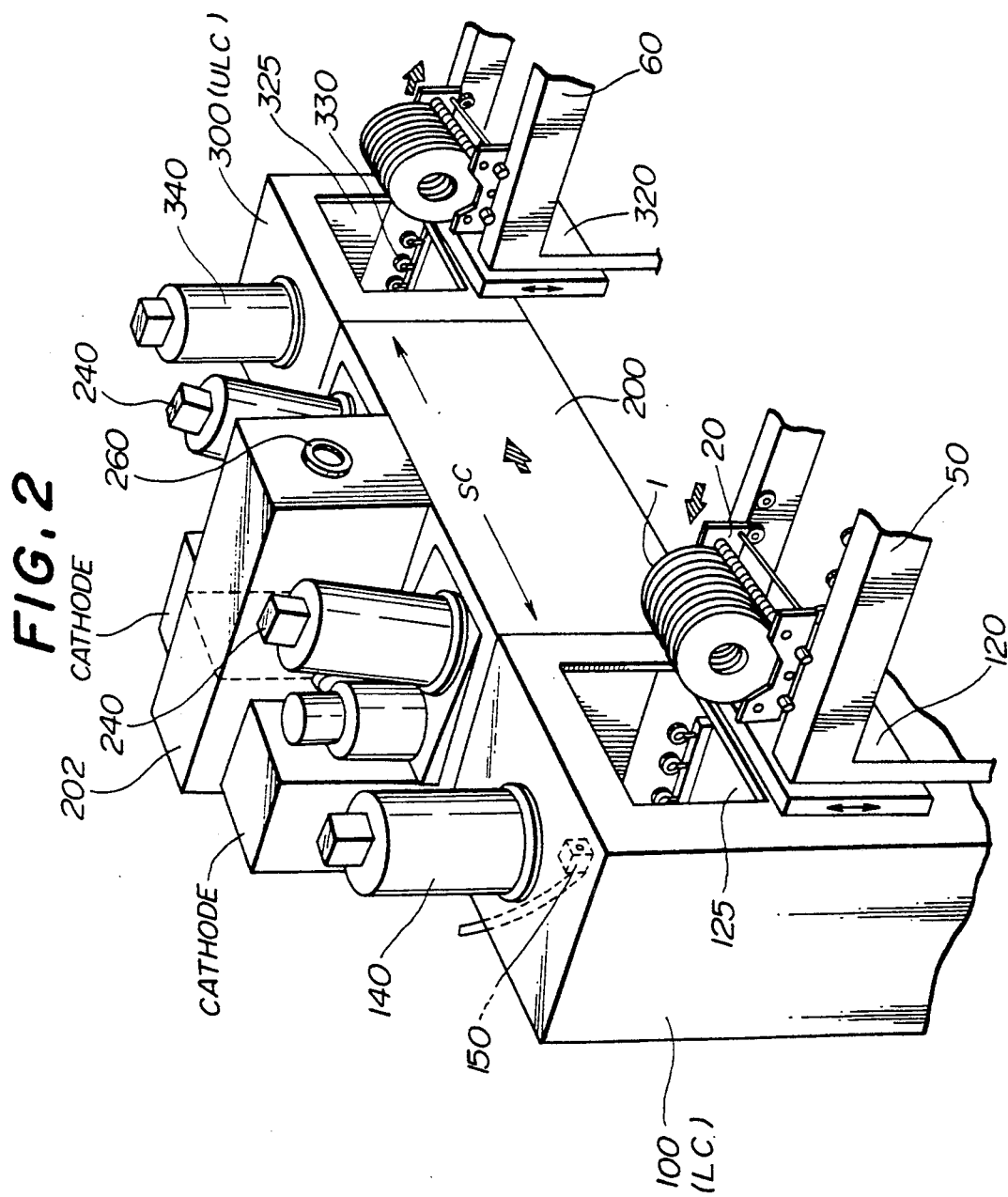
FIG. 2 is a perspective view of the double side continuous sputtering system shown in FIG. 1.

Referring to FIGS. 1 and 2, a double side continuous sputtering system is composed of a loading chamber (LC) 100, a sputtering chamber (SC) 200 and an unloading chamber (ULC) 300. An input transport conveyer 50 transports a holder 20, which holds a plurality of disk bases 1 (20 disk passes, for example). Each of the disk bases 1 has two opposite surfaces on which thin films are respectively formed by sputtering. An opening and shutting door 70 is provided at an interface between the loading chamber 100 and the sputtering chamber 200. Similarly, an opening and shutting door 80 is provided at an interface between the sputtering chamber 200 and the unloading chamber 300.

The disk bases 1 held by the holder 20 are inserted into the loading chamber 100 through a holder insertion opening 125 formed on a front surface of the loading chamber 100. A lid 120 is provided for the holder insertion opening 125. After the holder 20 is inserted into the loading chamber 100, the lid 120 is closed so that it totally covers the holder insertion opening 125 and thus an inner room of the loading chamber 100 is hermetically sealed.

Figure 3:
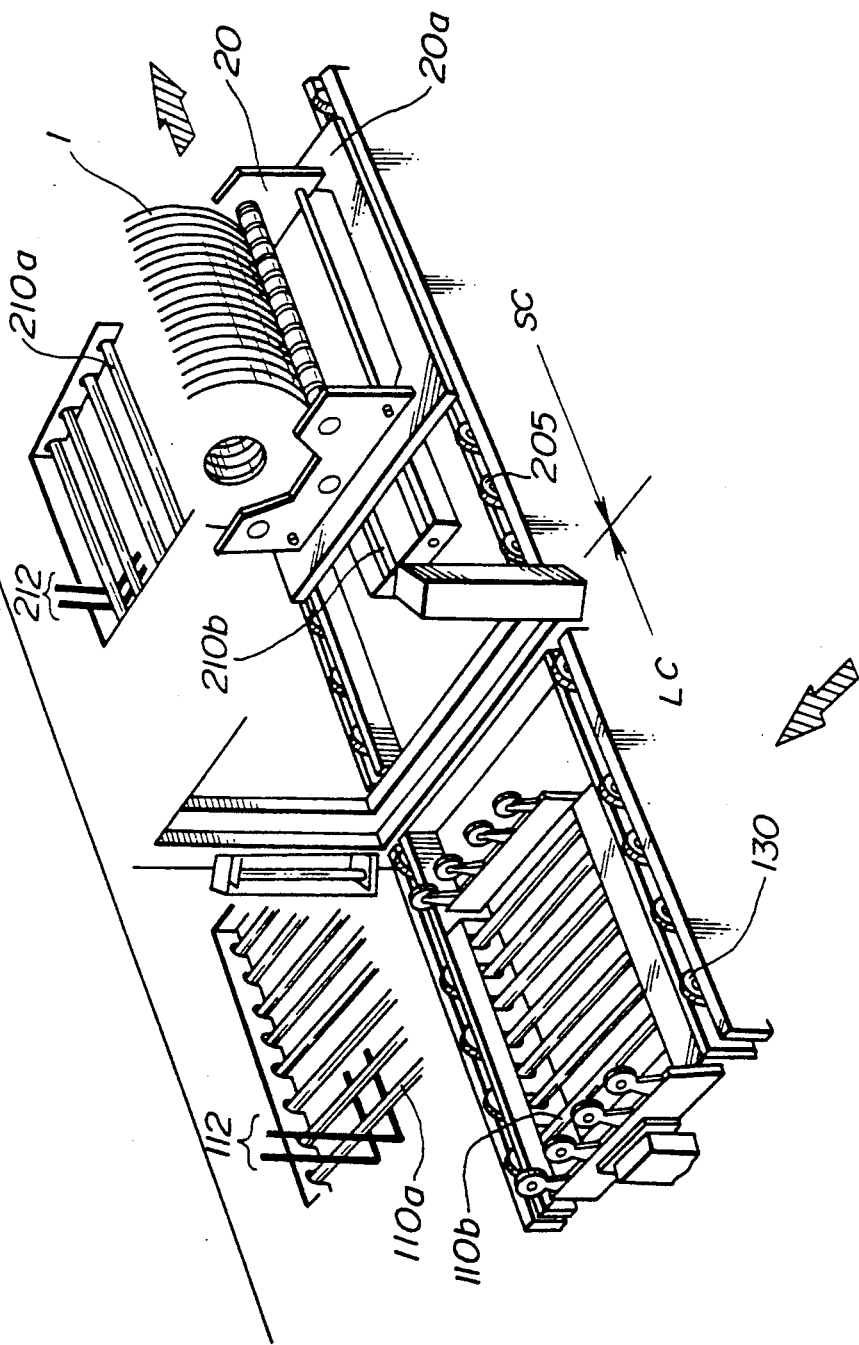
FIG. 3 is a perspective view illustrating an inner structure of a loading chamber and an inner structure of a sputtering chamber shown in FIGS. 1 and 2.

Referring to FIG. 3 in addition to FIGS. 1 and 2, a lamp heater 110a having a plurality of heating elements is provided at an upper portion of the loading chamber 100, and a lamp heater 110b having a plurality of heating elements is provided at a lower portion of the loading chamber 100. The lamp heaters 110a and 110b heat (preheat) the disk bases 1 held by the holder 20 so that each of the disk bases 1 has a predetermined temperature equal to, for example, about 210° C. The lamp heaters 110a and 110b also function to remove an impurity gas emitted from the disk bases 1 and moisture.

The loading chamber 100 has a transport conveyer 130 provided for transporting the entire holder 20 to the sputter chamber 200. Further, the loading chamber 100 has a cryopump 140. After the lid 120 is closed, the cryopump 140 starts to exhaust air toward the outside of the loading chamber 100 so that the inner room of the loading chamber 100 has a degree of vacuum almost equal to that of an inner room of the sputter chamber 200. During this operation, the opening and shutting door 70 is maintained in the closed state.

Then, the opening and shutting door 70 is opened. The transport conveyer 130 transports the holder 20 to the sputtering chamber 200 through an opening formed by opening the opening and shutting door 70. After the holder 20 is inserted into the sputtering chamber 200 and placed on a tray 20a (FIG. 3) on a transport conveyer 205, the opening and shutting door 70 is closed. Then, a leaf valve 150 (FIG. 2) mounted on a back surface of the loading chamber 100 is opened, so that the pressure of the inner room of the loading chamber 100 becomes equal to atmosphere pressure. After that, the lid 120 of the loading chamber 100 is opened and thus the loading chamber 100 is ready to receive a next set of disk bases 1 held by the holder 20.

As shown in FIG. 3, the sputtering chamber 200 has a lamp heater 210a having a plurality of heating elements, and a lamp heater 210b having a plurality of heating elements. The lamp heater 210a is provided at an upper portion above the transport conveyer 205a, and the lamp heater 210b is provided at a lower portion of the transport conveyer 205a. The lamp heaters 210a and 210b function to heat (preheat) the disk bases 1 held by the holder 20 and the transport conveyer 205 so that they are set to a predetermined temperature equal to, for example, 210° C. The lamp heaters 210a and 210b also function to remove an impurity gas emitted from the disk bases 1 and moisture.

A thermocouple 212 is provided in the vicinity of the lamp heater 210a, as shown in FIG. 3. Similarly, a thermocouple 112 is provided in the vicinity of the lamp heater 110a of the loading chamber 100. The thermocouples 112 and 212 are connected to a controller 400 (FIG. 1), which controls the entire system including a procedure for measuring the temperature of an area near the lamp heater 112 and the temperature of an area near the lamp heater 212. The controller 400 is formed of, for example, a microcomputer.

Figure 4:
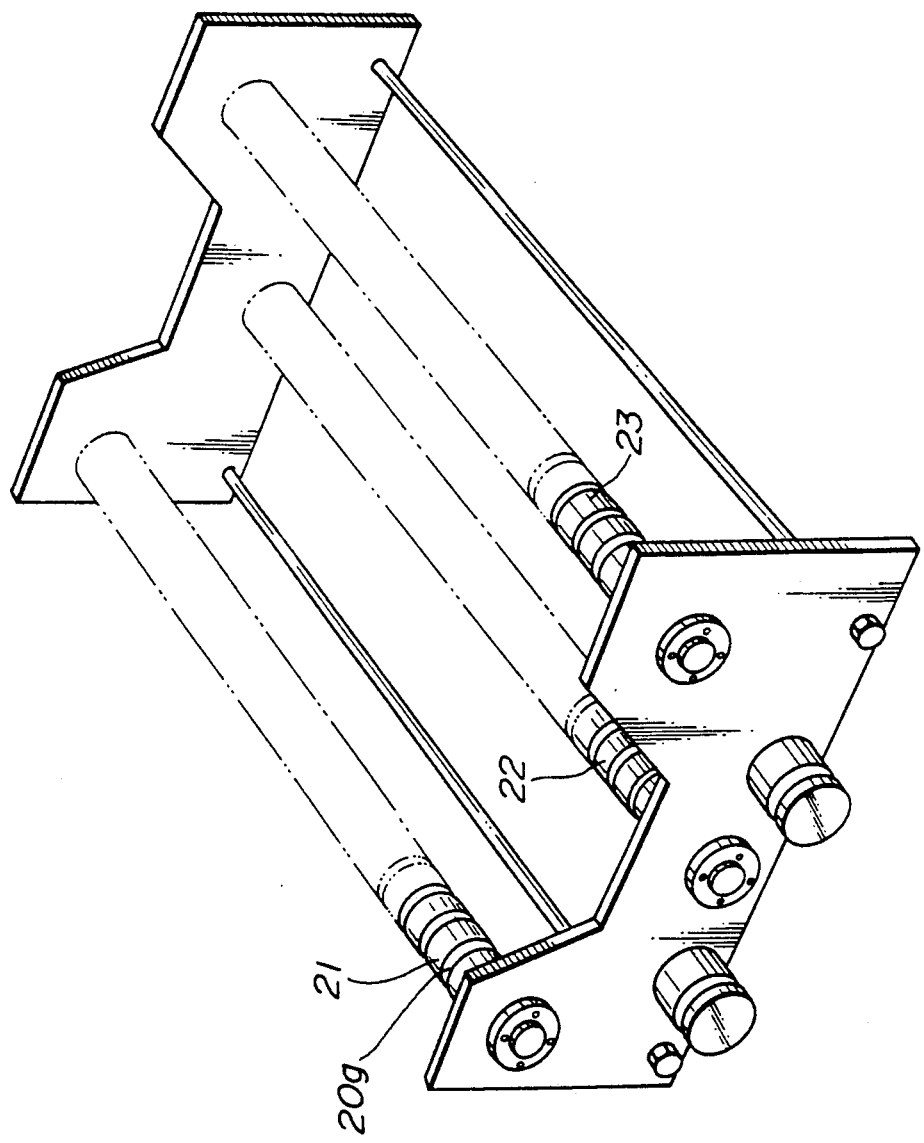
FIG.4 is a perspective view of a holder shown in FIGS. 1, 2 and 3.

Referring to FIG.4, there is illustrated the holder 20. The holder 20 has three shafts 21, 22 and 23. A plurality of grooves 20g are formed around each of the shafts 21, 22 and 23. A circumferential end portion of each disk base 1 engages with the corresponding grooves 20g of the three shafts 21, 22 and 23. The sputtering chamber 200 is provided with two cryopumps 240 (FIG. 2).

As shown in FIG. 1, the sputtering chamber 200 is divided into a transport room 201 and a sputtering room 202. The aforementioned transport conveyer 205 and the lamp heaters 210a and 210b are provided in the transport room 201. In the sputtering room 202, a magnetic thin film such as an $\alpha$-$Fe_2O_3$ film, is grown on each of the opposite surfaces of each disk base 1. As shown in FIG. 1, two targets 203a and 203b are disposed on both sides of the disk base 1 placed in the sputtering room 202. The targets 203a and 203b are sputtered, and thus α-Fe$_2$O$_3$ thin films are formed on the surfaces of the disk base 1.

Figure 5:
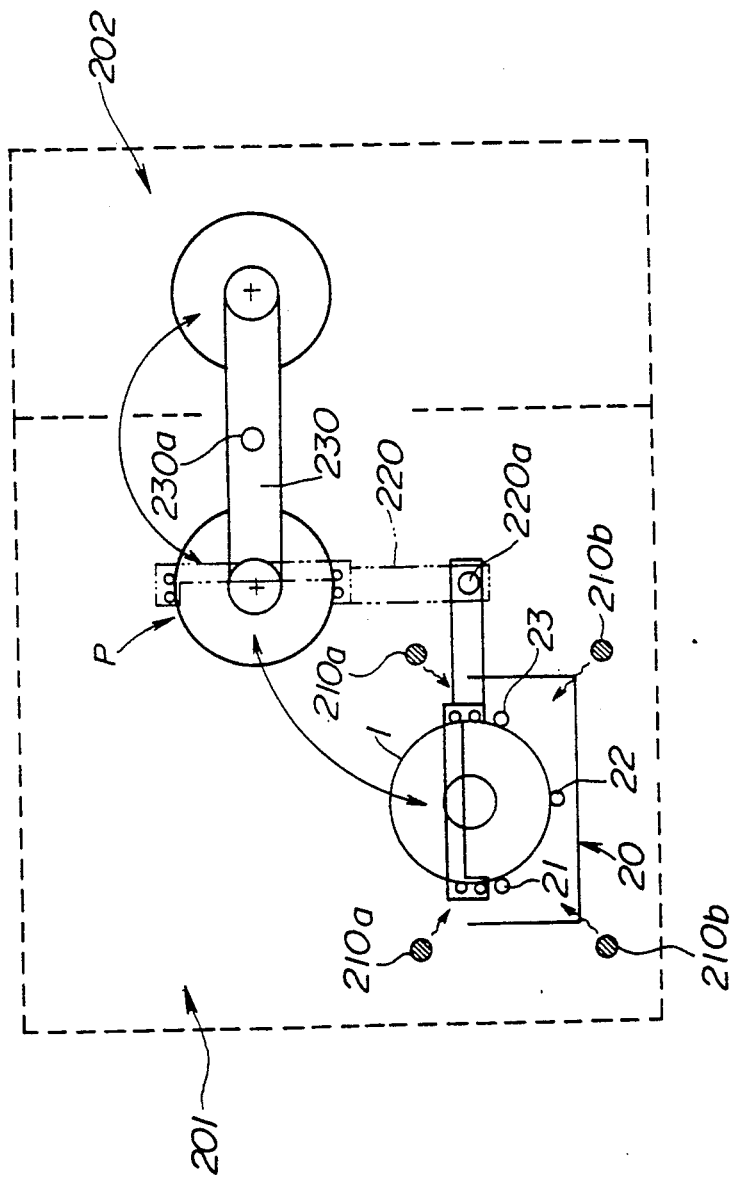
FIG. 5 is a schematic side view of the sputtering chamber shown in FIGS. 1 through 3.

As shown in FIG. 5, a handling arm 220 is provided in the transport room 201. The handling arm 220 is used for picking up the disk bases 1 held by the holder 20 one by one. The handling arm 220 is rotatable around a center shaft 220a, as indicated by the arrow shown in FIG. 5. When the handling arm 220 is positioned at a sputtering waiting position indicated by a character P, a sputtering arm 230 rotatable around a center shaft 230a accesses the disk base 1 positioned at the sputtering waiting position P, and holds inner circumferential portions of the disk base 1. In this way, the disk base 1 is passed from the handling arm 220 to the sputtering arm 230.

Figure 6:
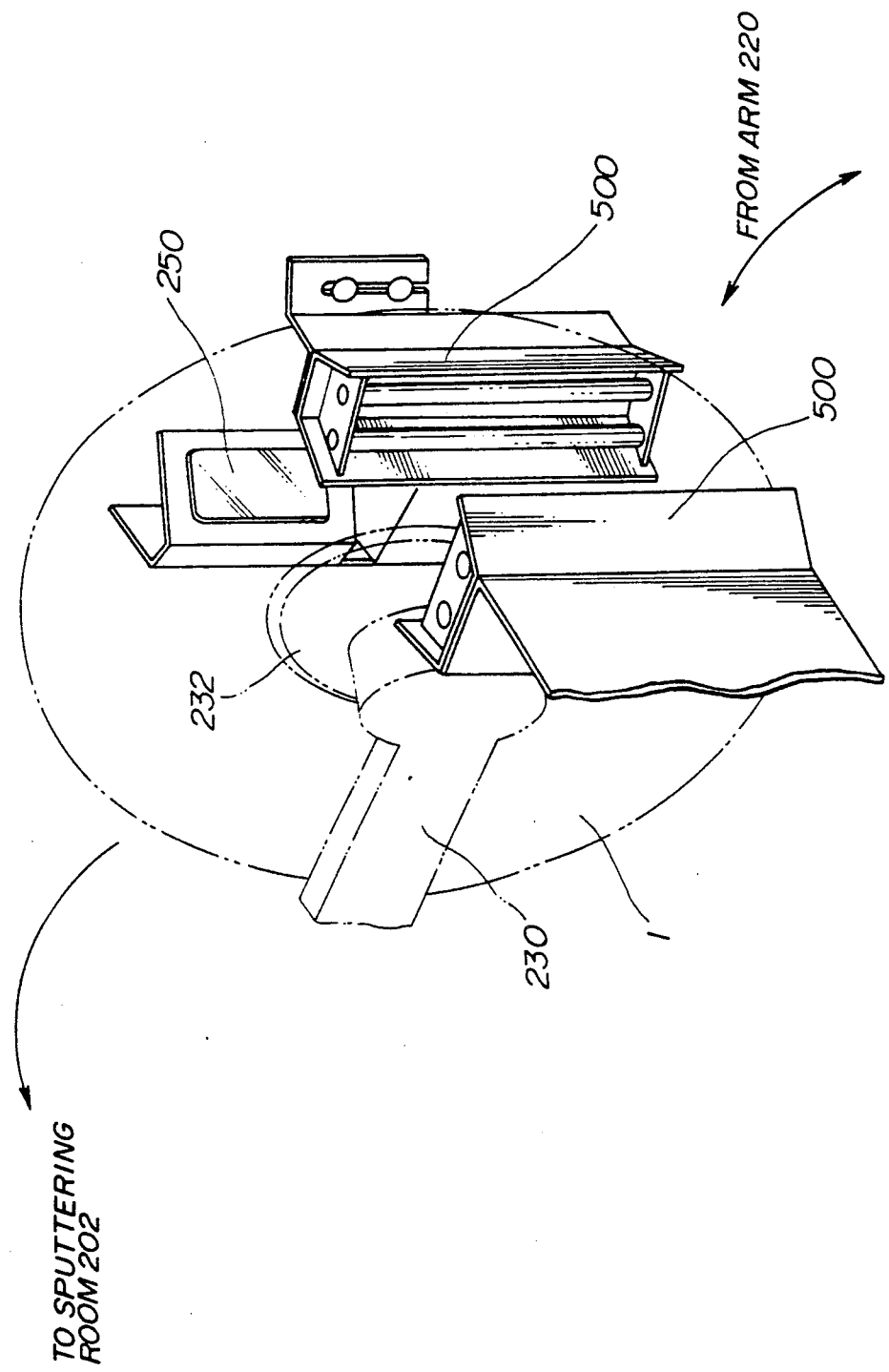
FIG. 6 is an enlarged perspective view illustrating a state where a disk base is waiting for a sputtering process.

The sputtering arm 230 has chucking mechanisms respectively provided on both ends thereof. FIG. 6 illustrates a chucking mechanism provided at one end of the sputtering arm 230. The chucking mechanism shown in FIG. 6 has a sputtering chuck 232, which holds the disk base 1 on both sides thereof. While the disk base 1 is being rotated by the chucking mechanism on one side of the sputtering arm 230 and being subjected to the sputtering process, the chucking mechanism on the other side thereof receives the disk base 1 from the handling arm 220. With the above-mentioned configuration, it is possible to successively move the disk bases 1 in the sputtering room 202 one by one and subject them to sputtering one by one.

More specifically, the handling arm 230 holds one of the disk bases 1 by one of the two chucking mechanisms. Then, the sputtering arm 230 rotates around the center shaft 230a by 180°, so that the disk base 1 is inserted into the sputtering room 202. Then, the sputtering process is carried out for about 3 minutes, for example. During sputtering, the holder 20 is driven to forward move a distance corresponding to one disk base by the transport conveyer 205, and the handling arm 220 takes out the disk base 1 from the holder 20 and places it at the sputtering waiting position P. The sputtering arm 230 holds the disk base 1 at the sputtering waiting position P by the other chucking mechanism.

After the sputtering process with respect to the disk base 1 held by one of the chucking mechanisms ends, the sputtering arm 230 is rotated around the center shaft 230a by 180°. Thereby, the disk base 1 held by the other chucking mechanism is inserted into the sputtering room 202, and the disk base 1 having the magnetic thin films grown on both sides thereof is passed to the handling arm 220. At the same time, the holder 20 is driven to backward move a distance corresponding to one disk base. Thus, the handling arm 220 places the disk base 1 at the original position. Then, the handling arm 220 is moved upward and the holder 20 is driven to move a distance corresponding to two disk bases by the transport conveyer 205. Then, the handling arm 220 takes out the next disk base 1 and places it at the sputtering waiting position P. Then, the disk base 1 at the sputtering waiting position P is passed to the sputtering arm 230.

The above-mentioned procedure is repeatedly carried out, and the sputtering process is successively carried out for the 20 disk bases 1 held by the holder 20.

As shown in FIGS. 1 and 6, a reflecting mirror 250 is provided in the transport room 201 of the sputtering chamber 200. The reflecting mirror 250 reflects a thermal radiation ray (which is illustrated by a dotted line) emitted from the disk base 1 held by the handling arm 220 or the sputtering arm 230 toward a view port 260 (FIG. 1), which has a glass plate and which is provided in a front surface of the sputtering room 202. The thermal radiation ray passes through the view port 260, and is then received by a thermal radiation ray thermometer 270 (FIG. 1), which is manufactured by, for example, CHINO SEISAKUSHO, Japan. The thermometer 270 detects the received thermal radiation ray, and outputs a corresponding electrical signal. A converter 280 converts the received electrical signal into corresponding video information, which is sent to a display device 290. The display device 290 is mounted on, for example, a control panel for use in remote control, which is placed in a control room different from a room where the system is placed.

It is desirable to detect a thermal radiation ray having a wavelength in a far infrared range when the disk bases 1 are formed of aluminum. It is preferable to determine the wavelength of the thermal radiation ray to be detected on the basis of a material forming the disk bases 1.

As shown in FIG. 2, the unloading chamber 300 has a transport conveyer 330, an eject opening 325 with a lid 320, and a cryopump 340 First, the cryopump 340 is activated, so that an inner room of the unloading chamber 300 is set to a substantially vacuum state. Next, the opening and shutting door 80 is opened. Then, the holder 20 is passed from the transport conveyer 205 to the transport conveyer 330 of the unloading chamber 300, and then the opening and shutting door 80 is closed. Then, a leaf valve (not shown for the sake of simplicity) like the leaf valve 150 (FIG. 1) is opened, so that the inner room of the unloading chamber 300 is returned to the atmosphere pressure. In this state, the lid 320 is opened so that the eject opening 325 is exposed. The holder 20 having the disk bases 1 having the grown thin films is passed to an output transport conveyer 60. After that, the lid 320 is closed and the inner room of the unloading chamber 300 is exhausted by the cryopump 340, so that the unloading chamber 300 is ready for the transport of the next holder 20.

According to the above-mentioned embodiments, it is possible to detect the temperature of the disk base 1 obtained immediately before it is inserted into the sputtering room 202 by means of the reflecting mirror 250, the thermometer 270, the temperature converter 280 and the display device 290. For example, information about the temperature is manually input to the controller 400. The controller 400 uses this temperature information in addition to the information obtained from the thermocouples 112 and 212 (FIG. 3), and controls the lamp heaters 110a, 110b, 210a and 210b so that the temperature of each disk base 1 obtained immediately before it is inserted into the sputtering room 202 becomes equal to a predetermined constant temperature.

A description will now be given of a second preferred embodiment of the present invention with reference to FIG. 7, in which those parts which are the same as those shown in the preceding figures are given the same reference numerals. The thin film forming system shown in FIG. 7 has a lamp heater 500 and a temperature controller 600. The lamp heater 500 heats the disk base 1 at the sputtering waiting position where the disk base 1 is rotated by one of the chucking mechanisms of the sputtering arm 230.

Figure 7:
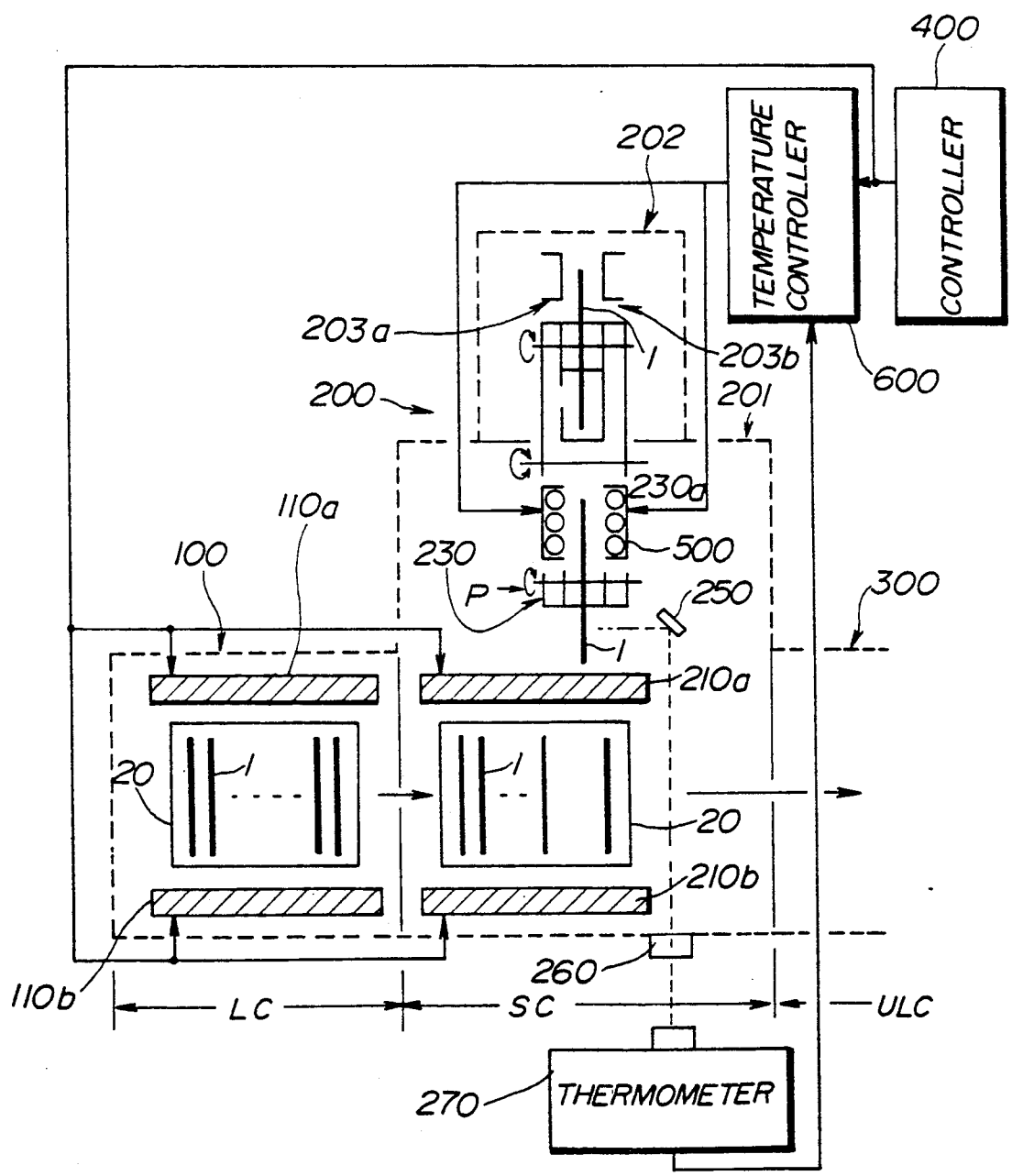
FIG. 7 is a diagram illustrating the entire structure of a double side continuous sputtering system according to a second preferred embodiment of the present invention.

As shown in FIGS. 6 and 7, the lamp heater 500 is provided on both the sides of the disk base 1 at the sputtering waiting position P The lamp heater 500 is controlled by the temperature controller 600. The temperature information (electrical signal) output by the thermometer 270 is directly sent to the temperature controller 600 as a feedback signal. The temperature controller 600 adjusts a driving current to be supplied to the lamp heater 500 in accordance with the temperature information in such a way that the temperature obtained immediately before the disk base 1 is inserted into the sputtering room 202 is approximately equal to the predetermined temperature. It will be noted that the controller 400 directly controls the lamp heaters 110a, 110b, 210a and 210b. Alternatively, it is possible to control these lamp heaters by using the feedback signal from the thermometer 270.

According to the second embodiment of the present invention, the temperature of the disk base 1 obtained immediately before it is inserted into the sputtering room 202 is measured and fed back to the temperature controller 600 in real time. Thus, it is possible to always set the temperature of each disk base 1 which is about to be inserted into the sputtering room 202 to the predetermined temperature at high reliability. Thus, it is possible to produce the disk bases 1 having almost the same characteristics in commercial quantity.

FIG. 8 is a graph showing the temperatures of various samples of disk bases obtained when they are individually placed in the sputtering waiting position P. A broken line curve is related to a prior art having no temperature control and a solid line curve is obtained by the present invention having the aforementioned temperature control. According to the present invention, the temperatures of the samples are substantially uniform, compared to those obtained by the prior art.

The present invention is not limited to the specifically disclosed embodiments, and variations and modifications may be made without departing from the scope of the present invention.

What is claimed is:

1. A thin film forming method comprising the steps of:
    (a) preheating a plurality of base plates transferred form a loading chamber and placed at a first position in a transport room of a deposition chamber;
    (b) sequentially picking up said base plates one by one by a pick-up member in a state where the pick-up member holds a part of a picked-up base plate, and positioning said picked-up base plate at a second position in the transport room;
    (c) heating both surfaces of said picked-up base plate at said second position by heater elements facing the both surfaces of said picked-up base plate so that a temperature of said picked-up base plate becomes approximately equal to a predetermined temperature and a temperature distribution of the base plates at the first position is corrected;
    (d) moving said picked-up base plate from said second position in the transport room to a third position in a deposition room of the deposition chamber close to said second position; and
    (e) growing a thin film on a surface of said picked-up base plate at said third position in the deposition room.

2. A thin film forming method as claimed in claim 1, wherein said step (c) comprises the step of (c-1) measuring the temperature of said picked-up base plate at said second position.

3. A thin film forming method as claimed in claim 2, wherein said step (c-1) comprises the steps of:
    detecting a thermal radiation ray emitted from said picked-up base plate; and
    detecting the temperature of said picked-up base plate on the basis of said thermal radiation ray detected by said step of detecting the thermal radiation ray.

4. A thin film forming method as claimed in claim 1, wherein said step (e) comprises the step of growing the thin film on both the surface of said picked-up base plate by a sputtering process.

5. A thin film forming method as claimed in claim 1, wherein each of said base plates is a disk member, and said thin film is formed of a magnetic material.

6. A thin film forming system comprising:
    first heating means for preheating a plurality of base plates transferred from a loading chamber and placed in a first room of a deposition chamber;
    pick up means for sequentially picking up said base plates one by one by holding apart of a picked-up base plate and for placing said picked-up base plate at a predetermined waiting position in said first room;
    second heating means for heating both surfaces of said picked-up base plate at said predetermined waiting by heater elements facing the both surfaces of said picked-up base plate so that a temperature distribution of the base plates in the first room is corrected;
    temperature measuring means for directly measuring a temperature of said picked-up base plate at said predetermined waiting position;
    control means for controlling said second heating means so that the temperature of said picked-up base plate measured by said temperature measuring means becomes approximately equal to a predetermined temperature;
    moving means for moving said picked-up base plate from said predetermined waiting position in said first room to a second room in the deposition chamber close to said first room; and
    thin film forming means for growing a thin film on a surface of said picked-up base plate in said second room of the deposition chamber.

7. A thin film forming system as claimed in claim 6, wherein said moving means comprises arm means for receiving said picked-up base plate at said predetermined waiting position and for rotating said picked-up base plate at said predetermined waiting position in a state where said picked-up base plate is heated by said second heating means.

8. A thin film forming system as claimed in claim 7, wherein said temperature measuring means comprises:
    a reflecting mirror which reflects a thermal radiation ray emitted from said base plate held at said predetermined waiting position; and
    detection means for detecting said thermal radiation ray reflected by said reflecting mirror and for generating an electrical signal from said thermal radiation ray detected by said detection means, said electrical signal being supplied to said control means.

9. A thin film forming system as claimed in claim 6, wherein said second heating position is provided near said predetermined waiting position.

10. A thin film forming system as claimed in claim 6, wherein said temperature measuring means comprises:
a reflecting mirror which reflects a thermal radiation ray emitted from said base plate held at said predetermined waiting position;
detection means for detecting said thermal radiation ray reflected by said reflecting mirror and for generating an electrical signal from said thermal radiation ray detected by said detection means, said electrical signal being supplied to said control means; and
wherein said control means comprises temperature control means for receiving said electrical signal supplied from said conversion means and for controlling said second heating means on the basis of said electrical signal so that the temperature of said base plate becomes approximately equal to said predetermined temperature.

11. A thin film forming system as claimed in claim 6, wherein said thin film forming means comprises sputtering means for forming said thin film on the opposite surface of said base plate by sputtering.

12. A thin film forming system as claimed in claim 6, further comprising means for maintaining said first room at a substantially vacuum state.

13. A thin film forming system as claimed in claim 6, wherein each of said base plates is a disk member and said tin film comprises a magnetic material.

14. A thin film forming system comprising:
conveyor means for transporting a holder holding a plurality of base plate from a loading chamber to a first room of a deposition chamber;
first heating means for heating said plurality of base plates held by said holder so that temperature of said base plates respectively become approximately equal to a first predetermined temperature;
first arm means for picking up said base plates from said holder one by one by holding a part of a picked-up base plate and for successively placing, one by one, said base plates at a predetermined waiting position in said first room;
temperature measuring means for directly measuring the temperature of said picked-up base plate at said predetermined waiting position;
second arm means for receiving said picked-up base plate at said predetermined waiting position and for placing said base plate in a second room of the deposition chamber close to said predetermined waiting position;
second heating means, provided near said predetermined waiting position, for heating both surfaces of said picked-up base plate at said predetermined waiting position by heater elements facing the both surfaces of said picked-up base plate so that a temperature distribution of the base plates in the first room is corrected;
control means, coupled to said temperature measuring means and said second heating means, for controlling said second heating means on the basis of the temperature of said base plate measured by temperature measuring means so that the temperature of said picked-up base plate becomes approximately equal to a second predetermined temperature; and
thin film forming means for growing a thin film on a surface of said picked-up base plate placed by said second arm means.

15. A thin film forming system as claimed in claim 14, wherein said first temperature is equal to said second temperature.

16. A thin film forming system as claimed in claim 14, wherein said temperature measuring means comprises:
a reflecting mirror which reflects a thermal radiation ray emitted from said base plate held at said predetermined waiting position; and
detection means for detecting said thermal radiation ray reflected by said reflecting mirror and for generating an electrical signal from said thermal radiation ray, said electrical signal being supplied to to said control means.

17. A thin film forming system as claimed in claim 17, wherein said control means comprises means for controlling said second heating means on the basis of said electrical signal supplied from said detection means.

18. A thin film forming system as claimed in claim 14, wherein said thin film forming means comprises sputtering means for forming said thin film on the opposite surface of said picked-up base plate by sputtering.

19. A thin film forming system as claimed in claim 18, wherein said deposition chamber is a sputtering chamber.

20. A thin film forming system as claimed in claim 14, wherein each of said base plates is a disk member and said thin film comprises a magnetic material.

21. A thin film forming system as claimed in claim 14, further comprising means for maintaining said first room at a substantially vacuum state.

22. A thin film forming system comprising:
first heating means for preheating a plurality of base plates transferred from a loading chamber and placed at a first position in a transport room of deposition chamber;
pick up means for sequentially picking up said base plates one by one by holding a part of a picked-up base plate and positioning said picked-up base plate at a second position in the transport room;
second heating means for heating both surfaces of said picked-up base plate at said second position by heater elements facing the both surfaces of said picked-up base plate so that a temperature of said picked-up base plate becomes approximately equal to a predetermined temperature and a temperature distribution of the base plates at the first position is corrected;
moving means for moving said picked-up base plate from said second position to a third position in a deposition room of the deposition chamber close to said second position: and
thin film forming means for forming a thin film on a surface of said picked-up base plate at said third position in the deposition room.

* * * * *

UNITED STATES PATENT AND TRADEMARK OFFICE
CERTIFICATE OF CORRECTION

PATENT NO. : 5,126,027
DATED : June 30, 1992
INVENTOR(S) : Kudo, et al

It is certified that error appears in the above-indentified patent and that said Letters Patent is hereby corrected as shown below:

On the Title Page, please add Item [73]: Fujitsu Limited Kawasaki-shi, Japan.

Signed and Sealed this

Second Day of August, 1994

Attest:

BRUCE LEHMAN

Attesting Officer    Commissioner of Patents and Trademarks